(12) United States Patent
Teramura

(10) Patent No.: US 11,769,853 B2
(45) Date of Patent: Sep. 26, 2023

(54) LIGHT EMITTING ELEMENT

(71) Applicant: NICHIA CORPORATION, Anan (JP)

(72) Inventor: Akihisa Teramura, Anan (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/681,564

(22) Filed: Feb. 25, 2022

(65) Prior Publication Data
US 2022/0181514 A1 Jun. 9, 2022

Related U.S. Application Data

(63) Continuation of application No. 16/943,983, filed on Jul. 30, 2020, now Pat. No. 11,289,623.

(30) Foreign Application Priority Data

Aug. 7, 2019 (JP) .................................. 2019-145120
Feb. 21, 2020 (JP) .................................. 2020-027907

(51) Int. Cl.
H01L 33/00 (2010.01)
H01L 25/075 (2006.01)
H01L 33/20 (2010.01)

(52) U.S. Cl.
CPC ...... H01L 33/0095 (2013.01); H01L 25/0753 (2013.01); H01L 33/20 (2013.01)

(58) Field of Classification Search
None
See application file for complete search history.

(56) References Cited

U.S. PATENT DOCUMENTS

| 2007/0148803 | A1 | 6/2007 | Yakushiji et al. |
| 2011/0133235 | A1* | 6/2011 | Hoshino ............... H01L 33/20 |
| | | | 257/E33.068 |
| 2013/0023076 | A1 | 1/2013 | Uchiyama |
| 2017/0005225 | A1 | 1/2017 | Okamoto et al. |
| 2017/0098733 | A1 | 4/2017 | Tamemoto et al. |

(Continued)

FOREIGN PATENT DOCUMENTS

| JP | 2006-135309 A | 5/2006 |
| JP | 2008-078440 A | 4/2008 |

(Continued)

OTHER PUBLICATIONS

Notice of Allowance in the related U.S. Appl. No. 16/943,983, dated Dec. 3, 2021.

*Primary Examiner* — Bradley Smith
(74) *Attorney, Agent, or Firm* — Global IP Counselors, LLP

(57) ABSTRACT

A light emitting element includes a substrate and a semiconductor structure. The substrate has a hexagonal shape in a top view. The semiconductor structure is disposed on an upper surface of the substrate. The first lateral surface of the substrate includes a first region including a modified region, the first region having an elongated shape extending along a first direction, a second region including a modified region, the second region having an elongated shape, and the first region and the second region being aligned along the first direction, and a third region disposed between the first region and the second region, the third region having a surface state different from a surface state of the first region or a surface state of the second region.

18 Claims, 9 Drawing Sheets

(56) References Cited

U.S. PATENT DOCUMENTS

| | | |
|---|---|---|
| 2018/0062032 A1* | 3/2018 | Okamoto ................ H01L 33/08 |
| 2018/0247871 A1 | 8/2018 | Inoue et al. |
| 2019/0164832 A1 | 5/2019 | Ueki |
| 2021/0005777 A1 | 1/2021 | Inoue et al. |

FOREIGN PATENT DOCUMENTS

| | | |
|---|---|---|
| JP | 2012-028452 A | 2/2012 |
| JP | 2013-042119 A | 2/2013 |
| JP | 2017-069510 A | 4/2017 |
| JP | 2018-037470 A | 3/2018 |
| JP | 2018-142702 A | 9/2018 |
| JP | 2019-102468 A | 6/2019 |
| WO | 2006/038713 A1 | 4/2006 |

* cited by examiner

LIGHT EMITTING ELEMENT

CROSS-REFERENCE TO RELATED APPLICATIONS

This application is a continuation application of U.S. patent application Ser. No. 16/943,983 filed on Jul. 30, 2020. This application claims priority to Japanese Patent Application No. 2019-145120 filed on Aug. 7, 2019, and Japanese Patent Application No. 2020-027907, filed on Feb. 21, 2020. The entire contents U.S. patent application Ser. No. 16/943,983 and Japanese Patent Application Nos. 2019-145120 and 2020-027907 are hereby incorporated herein by reference.

BACKGROUND

1. Technical Field

The present disclosure relates to a light emitting element.

2. Description of Related Art

It has been proposed that a wafer having a sapphire substrate and a semiconductor layer formed on an upper surface of the sapphire substrate is provided, then laser light is irradiated into the sapphire substrate to form a modified region, and the wafer is cleaved along a planned cleavage line passing through the modified region in top view of the wafer to obtain a plurality of light emitting elements from a single wafer.

SUMMARY

In a method of manufacturing a light emitting element according to Japanese Unexamined Patent Application Publication No. 2013-042119 A, a planned cleavage line forms a grid shape in a top view of a wafer. Thus, when a crack extends from a modified region along the planned cleavage line, the crack is unlikely to reach the inside of a region of an individual light emitting element, which will be obtained by cleavage of the wafer (hereinafter, may be referred to as a "light emitting element region").

On the other hand, when the light emitting element has a hexagonal shape in a top view, a portion of the light emitting element region is located on an extension of the planned cleavage line, resulting in the increase of possibility that the crack extending from the modified region reaches the inside of the light emitting element region. The crack reaching the light emitting element region causes a decrease in yield because the crack may cause chipping and the like of the light emitting element in a process of cleaving the wafer to divide the wafer into light emitting elements.

One object of the present disclosure is to provide a light emitting element in which a crack extending from a modified region is prevented from reaching the inside of a light emitting element region located on an extension of the modified region.

According to one embodiment of the present disclosure, a light emitting element includes a substrate and a semiconductor structure. The substrate has a hexagonal shape in a top view. The semiconductor structure is disposed on an upper surface of the substrate. The first lateral surface of the substrate includes a first region including a modified region, the first region having an elongated shape extending along a first direction, a second region including a modified region, the second region having an elongated shape, and the first region and the second region being aligned along the first direction, and a third region disposed between the first region and the second region, the third region having a surface state different from a surface state of the first region or a surface state of the second region.

According to certain embodiments of the present disclosure, it is possible to provide a light emitting element in which a crack extending from a modified region is prevented from reaching the inside of a light emitting element region located on an extension of the modified region.

DETAILED DESCRIPTION OF EMBODIMENTS

Figure 1A:
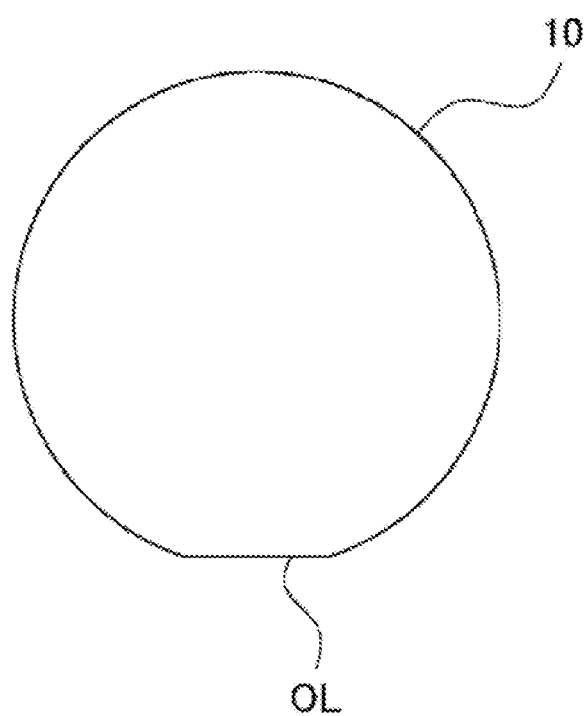
FIG. 1A is a schematic plan view of a wafer used in a method of manufacturing a light emitting element according to one embodiment of the present disclosure.

The embodiments shown below are examples for giving a tangible form to the technical idea of the present invention, and are not intended to limit the present invention to the description below. The size, the positional relationship and the like of the members shown in the drawings may be exaggerated for clarifying explanation. Further, the same designations and the same reference numerals generally represent like or similar members, and repetitive explanation thereof may be omitted when appropriate.

A method of manufacturing a light emitting element according to one embodiment includes: providing a wafer comprising a substrate formed of sapphire, and a semiconductor structure disposed on an upper surface of the substrate; scanning the wafer with laser light to irradiate laser light into the substrate to form a plurality of modified regions for cleaving the wafer into light emitting elements each having a hexagonal shape in a top view, the hexagonal shape having a first side having a first end and a second end, and a second side parallel to the first side; and cleaving the wafer along the modified regions to obtain the plurality of light emitting elements.

Further, the scanning laser light includes performing first scanning to form a plurality of first modified regions along a first direction parallel to the first side and the second side of the hexagonal shape. The first scanning includes: a first irradiation in which the laser light is scanned from a first end side of the first side to a first location between the first end of the first side and the second end of the first side, in a direction from the first end of the first side toward the second end of the first side; and second irradiation in which laser light is scanned from a second end side of the first side to a second location between the second end of the first side and the first end of the first side, in a direction from the second end of the first side toward the first location.

Figure 1B:
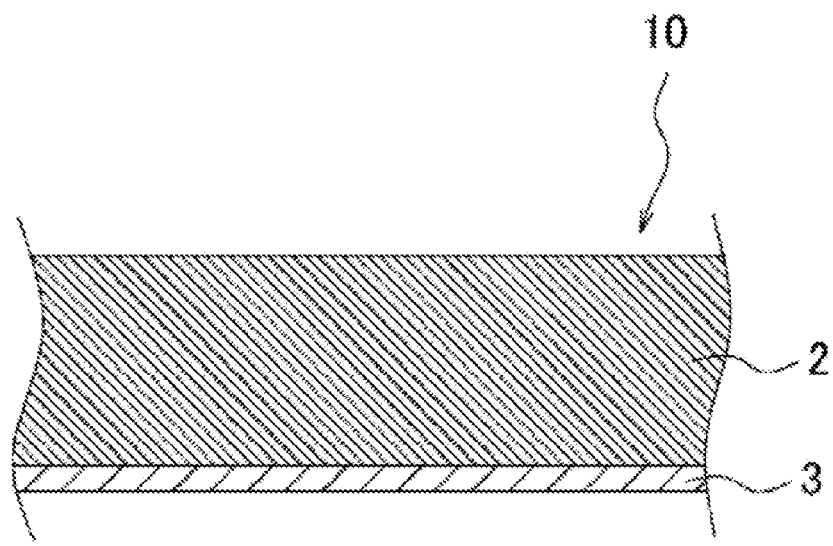
FIG. 1B is a schematic cross-sectional view of a portion of the wafer of FIG. 1A.
Figure 1C:
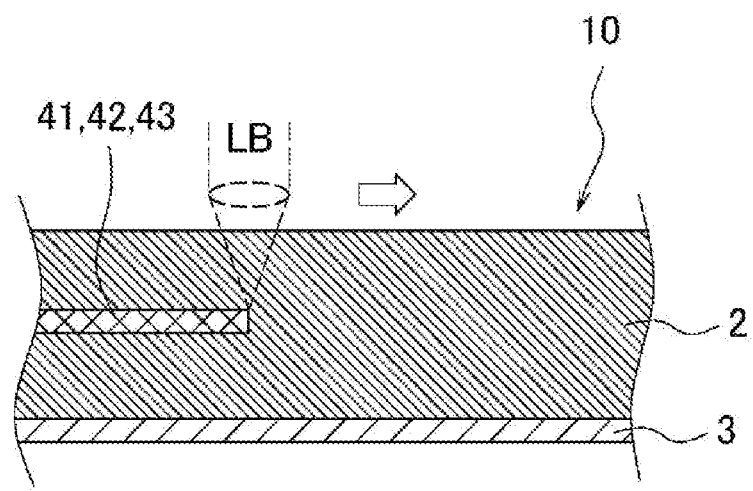
FIG. 1C is a schematic cross-sectional view for illustrating a process of irradiating the wafer of FIG. 1A with laser light.
Figure 1D:
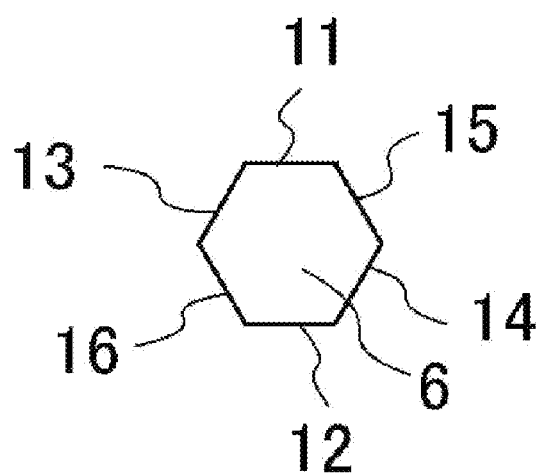
FIG. 1D is a schematic plan view for illustrating the process of irradiating the wafer of FIG. 1A with laser light.

Such a method of manufacturing allows for preventing a crack extending from the modified region from extending to a light emitting element region 6 as shown FIG. 1D. Accordingly, a light emitting element having a hexagonal shape in top view can be manufactured with a good yield.

The hexagonal shape of the light emitting element includes regular hexagons. The light emitting element may have a hexagonal shape in which one pair of opposite sides, among three pairs of opposite sides, have a length different from a length of the other two pairs of opposite sides.

Providing Wafer

As shown in FIGS. 1A and 1B, a wafer 10 having a substrate 2 formed of sapphire, and a semiconductor structure 3 disposed on an upper surface of the substrate 2 is provided. The wafer 10 has a substantially circular shape in atop view, and has a lateral surface provided with an orientation flat surface OL. The principal surface of the wafer 10 may be a C-plane, an A-plane and a R-plane, and may have an off-angle in a range of 1 degree to 5 degrees. The wafer 10 has a size with, for example, a diameter in a range of 50 mm to 150 mm. The substrate 2 may have a thickness in a range of, for example, 50 µm to 500 µm.

The semiconductor structure 3 has an n-side semiconductor layer, an active layer and p-side semiconductor layer layered in this order from the upper surface side of the substrate 2. For the n-side semiconductor layer, the active layer and the p-side semiconductor layer, for example, nitride semiconductors such as $In_XAl_YGa_{1-X-Y}N$ ($0 \le X$, $0 \le Y$, $X+Y<1$) may be used. An n-electrode is electrically connected to the n-side semiconductor layer, and a p-electrode is electrically connected to the p-side semiconductor layer. The semiconductor structure 3 may have any appropriate thickness.

In such a wafer, a plurality of regions to be light emitting elements each having a hexagonal shape in a top view is arranged to fill a plane. For example, in a top view, the regions to be light emitting elements can have a regular-hexagonal shape with all sides of the same length, and these regions are arranged in a honeycomb shape. Each side of the hexagonal shape preferably extends along the a-plane of the sapphire substrate in a top view. When the modified region is formed along the a-plane of the sapphire substrate having a hexagonal crystal structure, a crack is less likely to extend from the modified region than when the modified region is formed along the in-plane of the sapphire substrate. Accordingly, extension of a crack toward the light emitting element region 6 can be effectively reduced.

Forming a Plurality of Modified Regions

As shown in FIG. 1C, the provided wafer 10 is scanned with laser light LB to irradiate laser light LB into the substrate 2. Accordingly, a plurality of modified regions 41, 42 and 43 for cleaving the wafer into light emitting elements having a hexagonal shape in top view can be formed inside the substrate 2.

While the substrate 2 may be irradiated with laser light from a semiconductor structure 3 side of the wafer 10, it is preferable that the substrate 2 is irradiated with laser light from the substrate 2 side of the wafer 10 as shown in FIG. 1C. Accordingly, the modified regions 41, 42 and 43 can be formed inside the substrate 2 while preventing direct irradiation of the semiconductor structure 3 with laser light that may cause damage. In FIG. 1C, the modified regions 41, 42 and 43 are shown without distinction from each other for illustrating the formation of the modified region inside the substrate 2.

In the scanning with laser light LB, the wafer 10 is preferably irradiated with laser light by pulse-driving. In such irradiation, the output of laser light can be in a range of, for example, 0.5 W to 5 W. The frequency of laser light can be in a range of 50 kHz to 200 kHz. The pulse width of laser light can be in a range of, for example, 300 fsec to 1000 psec. The wavelength of laser light can be in a range of, for example, 500 nm to 1100 nm. More specifically, a picosecond laser having a central wavelength of 532 nm can be used for laser light. The irradiation/scanning speed of laser light may be 20 mm/sec to 2000 mm/sec. The spot diameter of laser light is in a range of, for example, 1 µm to 10 µm. The focal point of laser light is located in a range of 2% to 50%, preferably 3% to 20%, of the thickness of the sapphire substrate in the thickness direction of the sapphire substrate from a surface of the sapphire substrate on a side of being irradiated with laser light. More specifically, when the substrate has a thickness in a range of 50 µm to 500 µm, the focal point of laser light is located at a depth in a range of 15 µm to 250 µm, preferably 30 µm to 150 µm, from a surface of the sapphire substrate on a side irradiated with laser light.

The scanning with laser light LB can be performed using a laser light irradiation device known in the art. In this case, a laser light irradiation device configured to move a stage on which a wafer is placed, configured to move a laser light source, or configured to move both a stage and a laser light source may be used.

Figure 1E:
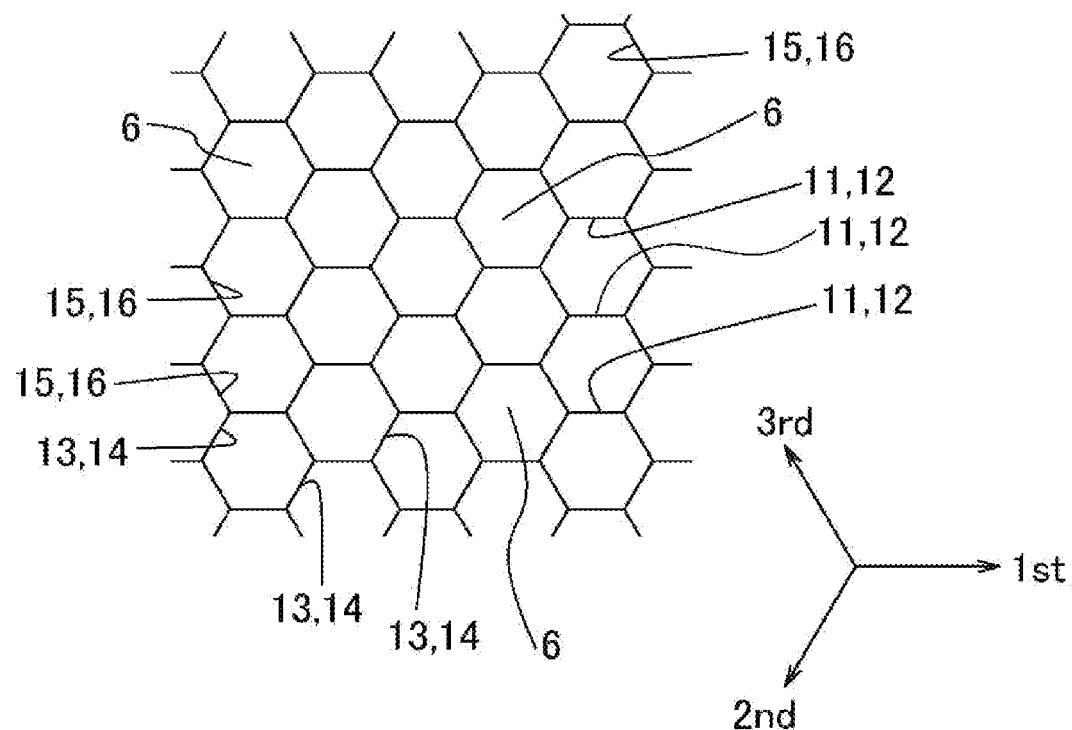
FIG. 1E is a schematic plan view for illustrating the process of irradiating the wafer of FIG. 1A with laser light.

As shown in FIG. 1D, in the scanning with laser light, three types of scanning, i.e., first scanning, second scanning and third scanning are performed to obtain light emitting elements having the light emitting element regions 6 each having a hexagonal shape in atop view. The term "light emitting region 6" as used herein refers to a region inside the six sides of the light emitting element. The first scanning, the second scanning and the third scanning are preferably performed along the m-axis or the a-axis of the sapphire substrate. More specifically, as shown in FIG. 1E, the first scanning includes performing scanning along a first direction parallel to a first side 11 and a second side 12 parallel to each other among the sides of the hexagonal shape to form a plurality of first modified regions 41 inside the substrate. The second scanning includes performing scanning along a second direction parallel to a third side 13 and a fourth side 14 parallel to each other among the sides of the hexagonal shape to form a plurality of first modified regions 42 inside the substrate 2. The third scanning includes performing scanning along a third direction parallel to a fifth side 15 and a sixth side 16 parallel to each other among the sides of the hexagonal shape to form a plurality of third modified regions 43 inside the substrate 3. Therefore, in a top view, the modified regions 41, 42 and 43 overlap respective planned cleavage lines for cleaving of the wafer 10. In FIG. 1E, the first direction, the second direction and the third direction are indicated with "1st", "2nd" and "3rd", respectively. In FIG. 1E, a plurality of sides along the first direction are collectively indicated as the first side 11 or the second side 12, a plurality of sides along the second direction are collectively indicated as the third side 13 or the fourth side 14, and a plurality of sides along the third direction are collectively indicated as the fifth side 15 or the sixth side 16. When scanning is performed linearly over sides of a plurality of light emitting elements, scanning is performed such that the modified regions are formed when scanning on the sides of the light emitting element, and the modified region is not formed when scanning on the light emitting element region 6. Therefore, in a single scanning, the modified region is formed in a form of a dashed line. When the wafer 10 is cleaved along the planned cleavage line, the wafer can be cleaved at a desired position without causing chipping and the like of the wafer, and the wafer can be divided with a good yield into a plurality of light emitting elements having a hexagonal shape in top view. In FIG. 1D, the first side 11 and the second side 12, parallel to each other, the third side 13 and the fourth side 14, parallel to each other and the fifth side 15 and the sixth side 16, parallel to each other, are identified.

First Scanning R1

Figure 2A:
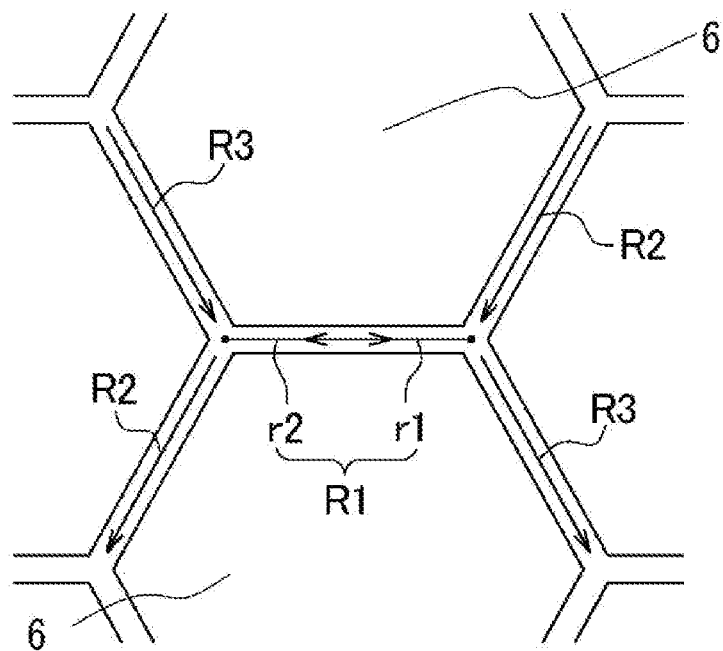
FIG. 2A is a schematic plan view for illustrating the process of irradiating the wafer of FIG. 1A with laser light.
Figure 2B:
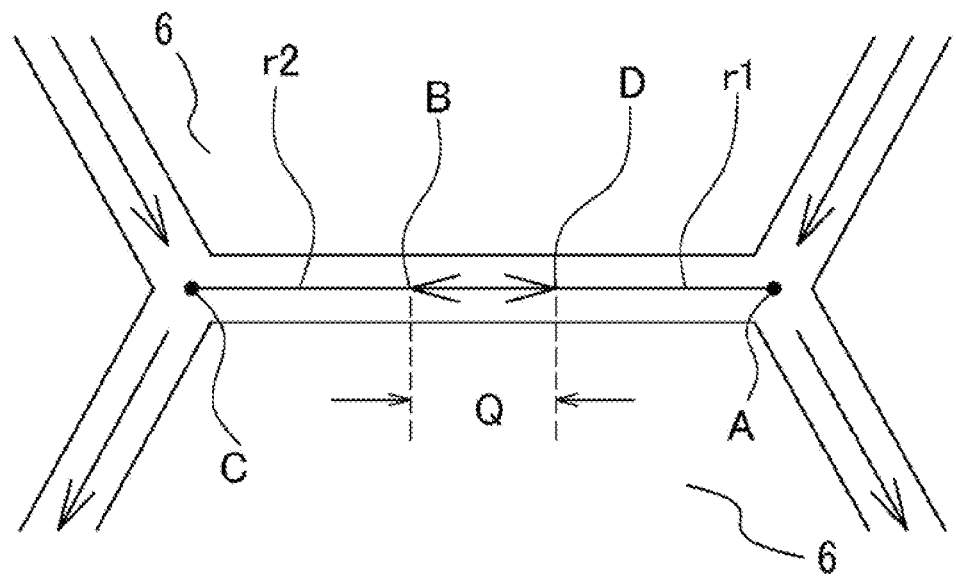
FIG. 2B is a schematic plan view for illustrating the process of irradiating the wafer of FIG. 1A with laser light.

A first scanning R1 includes a first irradiation r1 and a second irradiation r2 as shown in FIGS. 2A and 2B. In the first irradiation r1, the laser light is scanned from a first end A side of the first side 11 to a first position B between a first end A of the first side 11 and a second end C of the first side 11, in a direction from the first end A of the first side 11 toward the second end C of the first side 11. After the first irradiation, the second irradiation is performed, in which the laser light is scanned from a second end C side of the first side 11 to a second position D between the second end C of the first side 11 and the first end A of the first side 11, in a direction from the second end C of the first side 11 toward the first position B.

The first irradiation r1 and the second irradiation r2 may be started at locations apart from respective corresponding vertexes of the hexagonal shape, or at respective corresponding vertexes of the hexagonal shape.

The first position B and the second position D are located apart from the vertexes of the hexagonal shape. With the first position B and the second position D are located apart from respective corresponding vertexes of the hexagonal shape, a crack extending from a modified region near the first position B and the second position D can be effectively prevented from reaching the inside of the light emitting element region 6.

The first irradiation r1 and the second irradiation r2 in the first scanning R1 may be different in output, frequency, pulse width, wavelength and focal distance from the surface of the substrate, or may be partially or entirely identical in output, frequency, pulse width, wavelength and a distance between a surface of the substrate and a focal point. It is preferable that in particular, the first irradiation and the second irradiation in the first scanning are partially or wholly identical in output, frequency, pulse width, wavelength and a distance between a surface of the substrate and a focal point.

The first irradiation r1 and the second irradiation r2 in the first scanning R1 are performed over, for example, 80% or less, preferably 70% or less, of the length of a single side of the hexagonal shape of the light emitting element. When the first irradiation r1 and the second irradiation r2 are performed over 80% or less of the length of the side, the time required for manufacturing the light emitting element can be shortened while a crack extending from modified regions near the first position B and the second position D can be prevented from reaching the inside of the light emitting element region 6.

Also, it is preferable that a region irradiated in the first irradiation r1 and a region irradiated in the second irradiation r2 in the first scanning are partially overlapped as shown in FIGS. 2A and 2B. When the region irradiated in the first irradiation r1 and the region irradiated in the second irradiation r2 in the first scanning are partially overlapped, a distance Q between the first position B and the second position D is in a range of 5% to 50% of the length of the side. When the region irradiated in the first irradiation r1 and the region irradiated in the second irradiation r2 partially overlap each other, a region where modified regions overlap can be locally formed inside the sapphire substrate. In such a region where modified regions overlap, crack extensibility is high, and a crack easily occurs. Therefore, when the region irradiated in the first irradiation r1 and the region irradiated in the second irradiation r2 are partially overlapped to locally form a region where modified regions overlap in the sapphire substrate, it is possible to easily cleave the wafer in a step of cleaving a wafer as described below. The first position B and the second position D may entirely overlap each other.

Even when the region irradiated in the first irradiation r1 and the region irradiated in the second irradiation r2 are not overlapped, a crack extending from a modified region resulting from the first irradiation r1 and a crack extending from a modified region resulting from the second irradiation r2 are connected or are in proximity to each other along a single side, so that cleaving of the wafer as described below can be performed with a good yield.

For the hexagonal shape of a single light emitting element, a plurality of irradiations in opposite directions, such as the first irradiation and the second irradiation in the first scanning, is performed on at least the first side 11, and may be further performed on one or more of the second side 12, the third side 13, the fourth side 14, the fifth side 15, and the sixth side 16. In a single hexagonal light emitting element, performing a plurality of irradiations in opposite directions on a plurality of sides allows for further reducing the possibility that a crack reaches the inside of the light emitting element region.

The first irradiation and the second irradiation in the first scanning may be performed on, among sides of a plurality of hexagonal shapes, only sides parallel to a direction in which a crack generated in the formation of the modified region particularly easily extends. In this manner, while the takt time for manufacturing the light emitting element can be shortened, extension of a crack to the light emitting element region 6 can be effectively prevented as compared to a case where a plurality of irradiations in opposite directions are performed on all the sides of a plurality of hexagonal shapes. Crack extensibility may depend on the crystallinity of sapphire. Therefore, for example, when a crack particularly easily extends in the case of scanning the wafer with laser light in parallel to an orientation flat surface, it is preferable that the first irradiation and the second irradiation in the first scanning are performed on only sides parallel to the orientation flat surface, among the sides of one hexagonal shape.

The second irradiation r2 may be performed at any appropriate time as long as the second irradiation r2 is performed after the first irradiation r1. In particular, the second irradiation r2 is preferably performed after the third scanning R3 described below. With this manner, a crack extending from a modified region near the starting point of the second irradiation r2 is easily extended to a crack extending from a modified region resulting from the third scanning R3, and therefore the crack extending from a modified region near the starting point of the second irradiation r2 can be prevented from reaching the inside of the light emitting element region 6. When the second irradiation r2 is performed after the third scanning R3 described below, the second irradiation r2 may be performed before or after the second scanning R2.

Figure 2C:
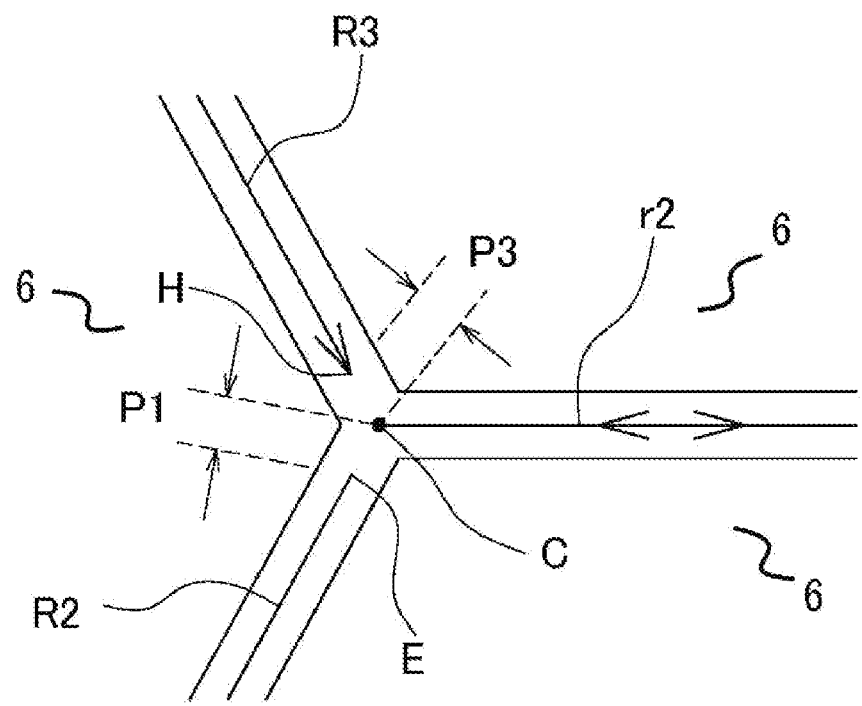
FIG. 2C is a schematic plan view for illustrating the process of irradiating the wafer of FIG. 1A with laser light.

For example, when the second irradiation r2 is performed after the second scanning R2, it is preferable that, as shown in FIG. 2C, the second irradiation r2 is performed without overlapping with a starting point E of the second scanning R2. In this manner, it is preferable that the second irradiation r2 is performed such that a distance P1 between a starting point C of the second irradiation r2 and the starting point E of the second scanning R2 is in a range of 2 μm to 30 μm. When the second irradiation r2 is performed such that the distance P1 between the starting point C of the second irradiation r2 and the starting point E of the second scanning R2 is in a range of 2 μm to 30 μm, the crack can be inhibited from reaching the inside of the light emitting element region 6, and the crack can be accurately connected to a crack from another modified region. Otherwise, when the distance P1 between the starting point C of the second irradiation r2 and the starting point E of the second scanning R2 is in a range of 2 μm to 30 μm, the distance between the crack and a crack from another modified region can be reduced so that these cracks are accurately connected when performing cleaving that will be described below.

Second Scanning R2

Figure 2D:
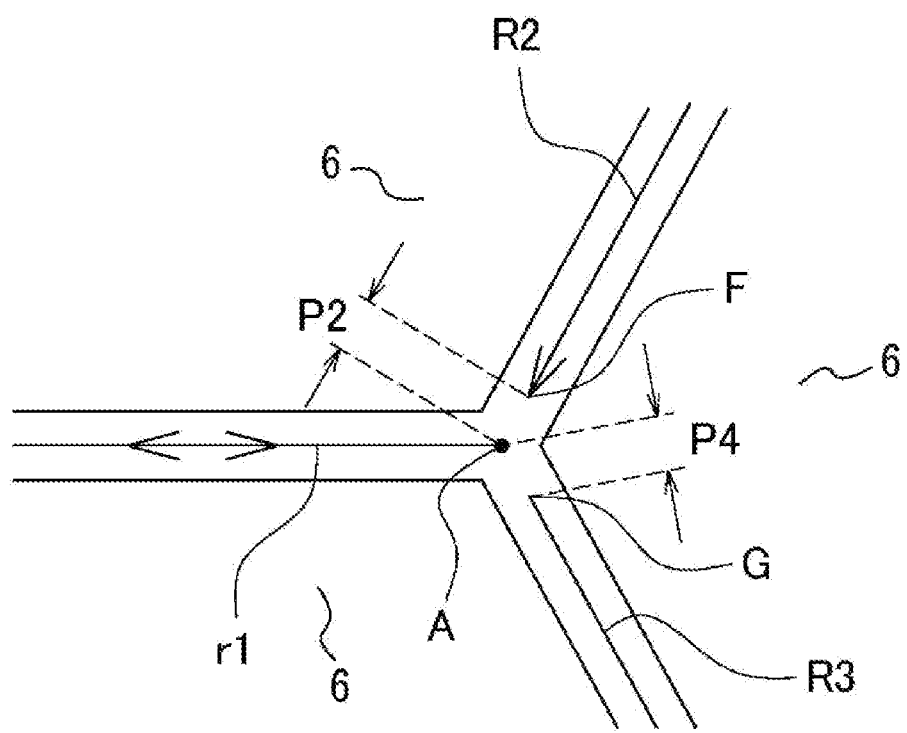
FIG. 2D is a schematic plan view for illustrating the process of irradiating the wafer of FIG. 1A with laser light.

It is preferable that, after the first irradiation, the second scanning R2 is performed toward the starting point of the first irradiation as shown in FIGS. 2A and 2D. With this manner, the crack that has already extended from the modified region resulting from the first irradiation can be connected to a crack extending from a modified region resulting from the second scanning R2, so that the crack can be inhibited from reaching the inside of the light emitting element region 6.

It is preferable that the second scanning R2 is performed without overlapping with the starting point of the first irradiation r1. With this manner, the second scanning R2 can be ended before reaching the starting point of the first irradiation r1, so that a crack extending from a modified region near an ending point of the second scanning R2 can be effectively inhibited from reaching the inside of the light emitting element region 6. In particular, the second scanning R2 is preferably performed such that a distance P2 between the ending point F of the second scanning R2 and the starting point of the first irradiation r1 is in a range of 2 μm to 30 μm. With this manner, the crack can be inhibited from reaching the inside of the light emitting element region 6, and the distance between a crack at the ending point of the second scanning R2 and a crack at the starting point of the first irradiation can be set so that these cracks are easily connected. When the second scanning R2 is ended before reaching the starting point of the first irradiation r1, the first irradiation r1 is preferably started at a vertex of the hexagonal shape. When the later-described third scanning R3 is performed after the second scanning R2, the second scanning R2 is preferably started at a vertex of the hexagonal shape.

The irradiation in the second scanning R2 may be different from or partially or entirely identical to the first irradiation r1 and the second irradiation r2 in the first scanning R1 and/or the irradiation in the third scanning R3 in output, frequency, pulse width, wavelength and a distance between a surface of the substrate and a focal point.

Third Scanning R3

It is preferable that, after the second scanning R2, the third scanning R3 is performed toward the starting point E of the second scanning R2 as shown in FIGS. 2A and 2C. In this manner, it is preferable that the third scanning R3 is performed without overlapping with the starting point E of the second scanning R2. In view described above, it is preferable that the third scanning R3 is performed such that a distance P3 between an ending point H of the third scanning R3 and the starting point C of the second irradiation is in a range of 2 μm to 30 μm. Further, it is preferable that a starting point G of the third scanning R3 and the starting point A of the first irradiation r1 are separated from each other as shown in FIG. 2D. A distance P4 between the starting point G of the third scanning R3 and the starting point A of the first irradiation r1 is preferably in a range of 2 μm to 30 μm as described above.

The irradiation in the third scanning R3 may be different from or partially or entirely identical to the first irradiation r1 and the second irradiation r2 in the first scanning R1 and/or the irradiation in the second scanning R2 in output, frequency, pulse width, wavelength and focal distance from a surface of the substrate. It is preferable that in particular, the first irradiation r1 and the second irradiation r2 in the first scanning R1, the irradiation in the second scanning R2 and/or the irradiation in the third scanning R3 are partially or entirely identical in output, frequency, pulse width, wavelength and a distance between a surface of the substrate and a focal point.

Each vertex of a hexagonal shape of a single light emitting element in a top view is scanned preferably at either the starting point or the ending point, particularly preferably at the starting point, of the second scanning R2, the third scanning R3, or the first irradiation r1 or the second irradiation r2 in the first scanning R1. With this manner, a crack extending from a modified region formed earlier and a crack extending from a modified region formed later can be connected at the vertex of the hexagonal shape, so that the crack can be inhibited from reaching the inside of the light emitting element region 6. A crack extending from a modified region tends to vary in degree of extension according to the traveling direction of laser light, and tends to more easily extend at the starting point at a scanning start side than at the ending point at a scanning end side. Accordingly, with the ending point located apart from a corresponding vertex, a crack from a modified region can be effectively inhibited from extending to the inside of the light emitting element region 6.

For example, when a thickness of the substrate 2 is increased, and thus cleaving of the substrate 2 is not easy, a plurality of modified regions may be formed in the thickness direction of the substrate 2. In this case, conditions for forming a modified region that is formed at the greatest depth from a surface of the substrate 2 irradiated with laser light tends to affect the extension state of cracks extending from the modified regions. Therefore, when a plurality of modified regions is formed in the thickness direction of the substrate 2, conditions described above for irradiation with laser light may be satisfied for at least a modified region that is formed at the greatest depth from a surface of the substrate 2 irradiated with laser light.

When the substrate 2 is irradiated with laser light a plurality of times, the irradiation positions inside the substrate 2 may be set at the same depth in the irradiation with laser light a plurality of times.

Cleaving

The wafer 10 is cleaved along modified regions formed by irradiation with laser light, so that a plurality of light emitting elements having a hexagonal shape in a top view is obtained. With this manner, the wafer is cleaved along an intended planned cleavage line without deviating from the planned cleavage line. Thus, light emitting elements having a hexagonal shape in a plan view can be manufactured with a good yield.

The wafer is preferably cleaved using a stretchable sheet or the like. That is, the wafer can be cleaved by attaching the wafer to the stretchable sheet, and stretching the stretchable sheet. The wafer may be cleaved using a method using a chip breaker with a roller, a notch, or the like.

In this embodiment, a surface of the substrate on which a semiconductor layered body is not formed may be ground and/or polished at any appropriate time, such as after formation of the semiconductor structure 3, after formation of an exposed groove of the n-side semiconductor layer, before or after irradiation with laser light, or before cleavage of a wafer. The smaller a resulting thickness after grinding and/or polishing decreases, the smaller the damage to the semiconductor layered body or the like during cleavage of the wafer, so that hexagonal light emitting elements can be efficiently obtained. However, excessively small resulting thickness of the wafer may cause an increase in the warpage of the wafer. This may result in difficulty in the cleaving of the wafer or breakage of the wafer. Therefore, it is preferable that the wafer is ground and/or polished so that the thickness of the wafer is in a range of, for example, 50 μm to 300 μm.

For grinding and polishing the wafer, any appropriate method known in the art may be used. In particular, it is preferable to grind and polish the wafer using abrasive grains of diamond or the like.

Light Emitting Element

Figure 3A:
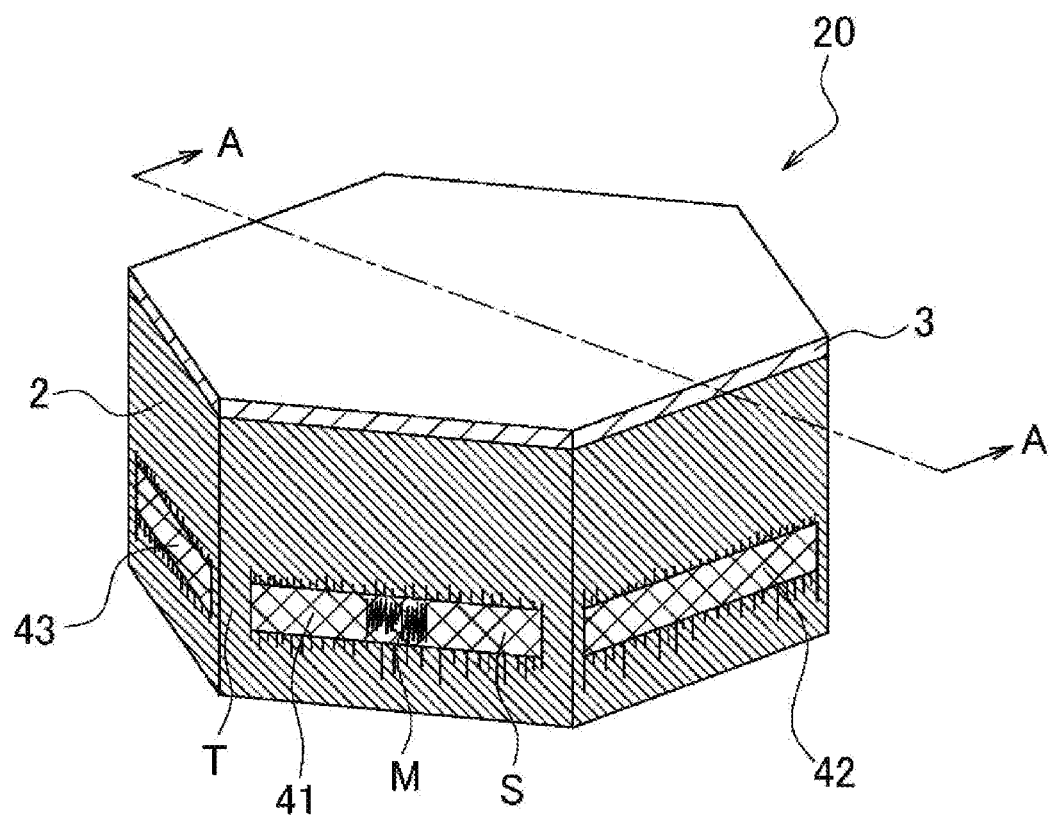
FIG. 3A is a schematic perspective view of a light emitting element manufactured using the method of manufacturing a light emitting element according to one embodiment of the present disclosure.
Figure 3B:
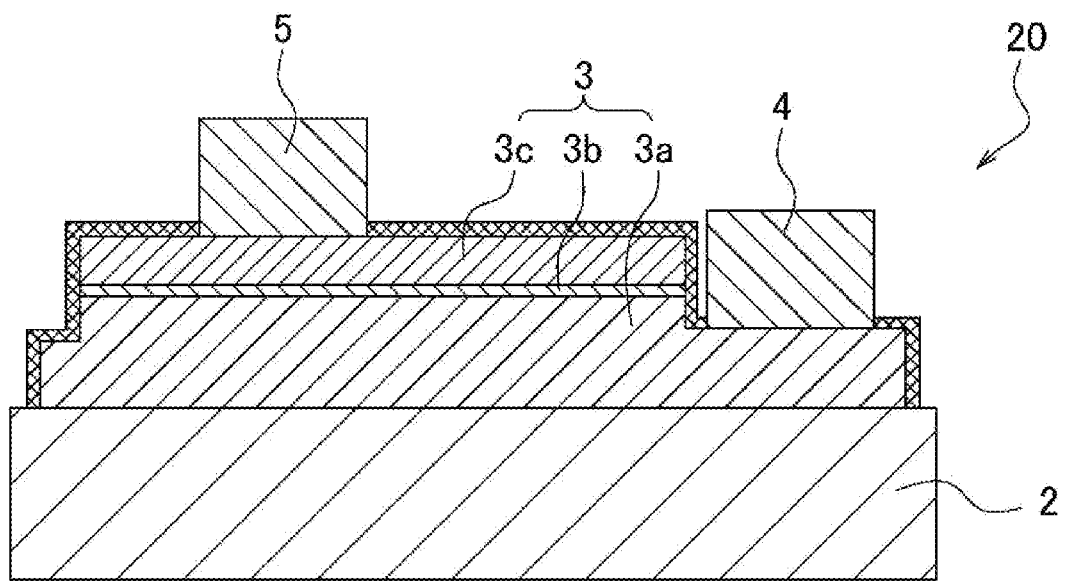
FIG. 3B is a schematic cross-sectional view taken along line A-A' in the light emitting element of FIG. 3A.
Figure 3C:
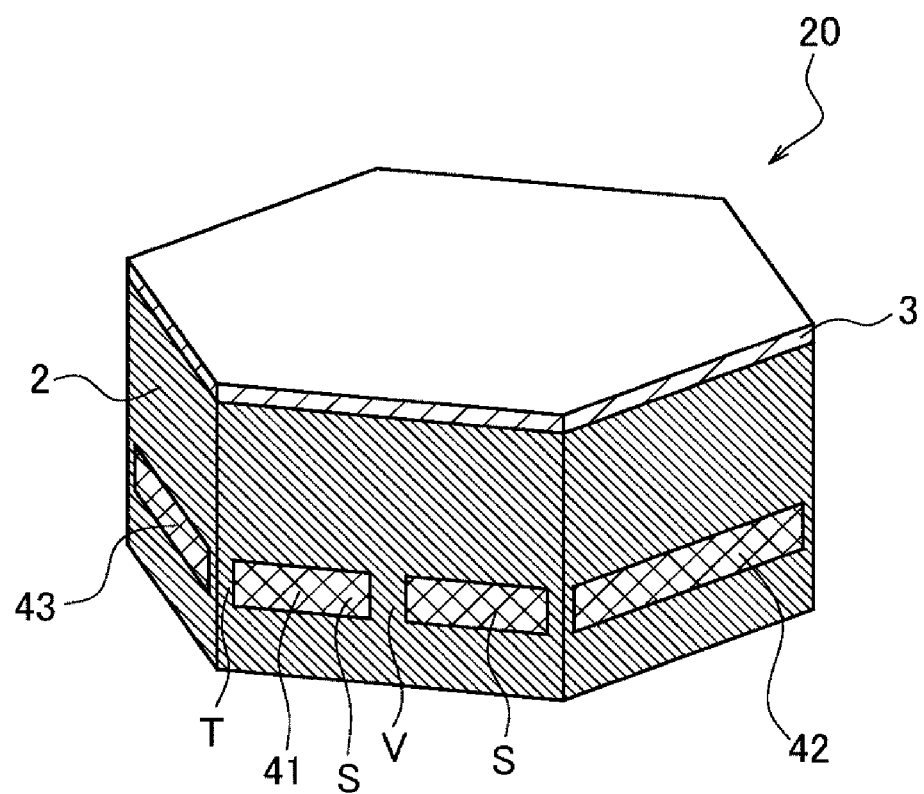
FIG. 3C is a schematic perspective view of a light emitting element manufactured by the method of manufacturing a light emitting element according to one embodiment of the present disclosure.

As shown in FIGS. 3A, 3B and 3C, a light emitting element 20 obtained using the method described above includes a substrate 2 formed of sapphire, and a semiconductor structure 3 on an upper surface of the substrate, and has a hexagonal shape in a plan view.

The semiconductor structure 3 includes a semiconductor layer of, for example, $In_XAl_YGa_{1-X-Y}N$ (0≤X, 0≤Y, X+Y<1), in which an n-side semiconductor layer 3a, an active layer 3b and a p-side semiconductor layer 3c are layered sequentially from the upper surface side of the substrate 2. An n-electrode 4 is electrically connected to the n-side semiconductor layer 3a, and a p-electrode 5 is electrically connected to the p-side semiconductor layer 3c. In FIG. 3A, illustration of the n-electrode 4 and the p-electrode 5 is omitted.

As shown in FIG. 3A, a modified region appears on a lateral surface of the substrate 2 formed of sapphire in the light emitting element according to this embodiment. A portion where the modified region appears has a rougher surface as compared to other regions in the lateral surface of the substrate 2, and can be recognized as a region where fine irregularities are formed. Further, as shown in FIG. 3A, a single lateral surface of the substrate 2 formed of sapphire may include a region S where a modified region resulting from laser irradiation is formed, and a region M (example of the third region) formed between adjacent regions S (examples of the first region and the second region) and having a surface state different from that of the region S. The region M is a portion where a modified region is densely formed at a position where laser light is concentrated and its vicinity, due to overlapping between first irradiation r1 and second irradiation r2 inside the substrate 2. For example, an arithmetic mean roughness of the region M is larger than the arithmetic mean roughness of the region S.

Further, as shown in FIG. 3A, a single lateral surface of the sapphire substrate may include a region T (example of the fourth region), which is obtained by cleaving caused by a crack without being irradiated with laser light and which has no modified region, at a portion corresponding to a vicinity of a vertex of the hexagonal shape. Therefore, lateral surfaces of the substrate 2, formed of sapphire, in the light emitting element may include a strip-shaped region corresponding to the region S and a region corresponding to the region T. The region T may have a crack extending from the region S. Lateral surfaces of the sapphire substrate may not include the region T.

As shown in FIG. 3C, in another example of the light emitting element according to this embodiment, a single lateral surface of the substrate 2 formed of sapphire may include the region S, and a region V, which is located between adjacent regions S and has a surface state different from that of the regions S. The region V is a region that appears to interrupt a modified region. For example, with the dense formation of a modified region, chipping of sapphire occurs in the densely-formed modified region, with the result that the modified region appears to be interrupted by the region V. Such chipping of sapphire is not a large chipping that may lead to reduction of the yield of light emitting elements. In another aspect, it is thought that a modified region formed by first irradiation r1 causes deviation of the position at which laser light LB in second irradiation r2 is concentrated inside the substrate 2, resulting in difficulty to form a modified region by the second irradiation r2. Accordingly, no modified region may be formed in the region V. A crack extending from the region S may appear in the region V. For example, the arithmetic mean roughness of the region V is smaller than the arithmetic mean roughness of the region S.

Example

In Example, a wafer 10 was provided in which a semiconductor structure 3 containing a nitride semiconductor was disposed on a C-plane of a substrate 2 formed of sapphire as shown in FIG. 1A. The substrate 2 had a diameter of 4 inches, and the wafer 10 had a thickness of 200 μm after polishing. Thereafter, the semiconductor structure was partially etched to be removed, and a first electrode and a second electrode were formed to be connected to the n-side semiconductor layer and the p-side semiconductor layer, respectively.

Subsequently, the obtained wafer was attached on a stretchable sheet, and laser light LB was irradiated into the substrate 2 as shown in FIG. 1C. Scanning with laser light LB included first scanning, second scanning, and third scanning. Each of the first scanning, the second scanning, and the third scanning with laser light LB was performed along the m-axis of the sapphire substrate. In the scanning with laser light LB, first scanning was performed along a first direction to form a modified region 41, second scanning was performed along a second direction to form a modified region 42, and third scanning was performed along a third direction to form a modified region 43, so that a light emitting element region 6 having a hexagonal shape in top view was obtained. In this formation of the modified region, laser light was irradiated in the order of the first irradiation in the first scanning, then the second scanning, the third scanning, and the second irradiation in the first scanning. The first irradiation in the first scanning and the second irradiation in the first scanning were performed in a direction parallel to an orientation flat surface of the wafer 10 in a plan view. Irradiation with laser light in each of the first scanning, the second scanning, and the third scanning was performed twice from a side of a surface of the wafer 10 which was not provided with a semiconductor layered body. The position at which light was concentrated in each of the two irradiations was set to a position at a depth of 25 μm from the lower surface of the substrate 2. Irradiation with laser light was performed at an output of 0.18 W, a scanning rate of 400 mm/s, a frequency of 50 kHz, a pulse width of 500 psec, a wavelength of 532 nm and a spot diameter of about 1 μm to 2 μm. The first scanning was performed such that the ending point of the first irradiation coincided with the ending point of the second irradiation.

Subsequently, by pressing the wafer 10 with a metallic spherical body from a laser light irradiation side of the substrate 2, the wafer 10 is cleaved along the modified regions 41, 42 and 43, so that light emitting elements having a hexagonal shape in a plan view were obtained.

The yield of the light emitting elements obtained through these operations was evaluated.

In Comparative Example, light emitting elements having a regular hexagonal shape in a plan view were manufactured by performing irradiation with laser light under the same conditions as described above, except that laser light was continuously irradiated to a region corresponding to a single side of the light emitting element in the first scanning instead of performing first irradiation and second irradiation in the first scanning.

One-hundred light emitting element regions were randomly selected from light emitting element regions obtained from a wafer in each of Comparative Example and Example. Then, among the randomly-selected light emitting element regions, the number of light emitting element regions into which a crack was extended was determined. The result showed that, in Comparative Example, the ratio of light emitting element regions with a crack extending to the inside of the light emitting element region was 92%. On the other hand, in Example, the ratio of light emitting element regions with a crack extending to the inside of the light emitting element region was 18%.

Much lower ratio of light emitting element regions into which a crack extends in Example than that in Comparative Example is thought to be resulted from coincidence between a direction in which a crack easily extends in a sapphire substrate and a direction of a side on which the first irradiation in the first scanning and the second irradiation in the first scanning were performed in Example. That is, in Example, it is thought that, with coincidence between a direction parallel to an orientation flat surface of the wafer 3 in a plan view and a direction in which a crack easily extends in a sapphire substrate, performing the first irradiation in the first scanning and the second irradiation in the first scanning in a direction parallel to an orientation flat surface of the wafer 3 in a plan view allowed for reducing the ratio of light emitting element regions into which a crack extended.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light emitting element comprising:
    a substrate having a hexagonal shape in a top view; and
    a semiconductor structure disposed on an upper surface of the substrate, wherein
    a first lateral surface of the substrate includes
        a first region including a modified region, the first region having an elongated shape extending along a first direction,
        a second region including a modified region, the second region having an elongated shape, and the first region and the second region being aligned along the first direction, and
        a third region disposed between the first region and the second region, the third region having a surface state different from a surface state of the first region or a surface state of the second region.

2. The light emitting element according to claim 1, wherein
    the third region includes a modified region, and
    a density of the modified region in the third region is larger than a density of the modified region in the first region or a density of the modified region in the second region.

3. The light emitting element according to claim 1, wherein
    an arithmetic mean roughness of the third region is larger than an arithmetic mean roughness of the first region or an arithmetic mean roughness of the second region.

4. The light emitting element according to claim 2, wherein
    an arithmetic mean roughness of the third region is larger than an arithmetic mean roughness of the first region or an arithmetic mean roughness of the second region.

5. The light emitting element according to claim 1, wherein
    the third region includes a modified region, and
    a density of the modified region in the third region is smaller than a density of the modified region in the first region or a density of the modified region in the second region.

6. The light emitting element according to claim 1, wherein
    an arithmetic mean roughness of the third region is smaller than an arithmetic mean roughness of the first region or an arithmetic mean roughness of the second region.

7. The light emitting element according to claim 5, wherein
    an arithmetic mean roughness of the third region is smaller than an arithmetic mean roughness of the first region or an arithmetic mean roughness of the second region.

8. The light emitting element according to claim 1, wherein
    the third region does not include a modified region.

9. The light emitting element according to claim 5, wherein
    the third region does not include a modified region.

10. The light emitting element according to claim 6, wherein
    the third region does not include a modified region.

11. The light emitting element according to claim 1, wherein
    the first region is spaced apart from an outer edge of the first lateral surface of the substrate in the first direction, and
    the first lateral surface of the substrate further includes a fourth region having a surface state different from the surface state of the first region between the first region and the outer edge of the first lateral surface of the substrate.

12. The light emitting element according to claim 2, wherein
the first region is spaced apart from an outer edge of the first lateral surface of the substrate in the first direction, and
the first lateral surface of the substrate further includes a fourth region having a surface state different from the surface state of the first region between the first region and the outer edge of the first lateral surface of the substrate.

13. The light emitting element according to claim 3, wherein
the first region is spaced apart from an outer edge of the first lateral surface of the substrate in the first direction, and
the first lateral surface of the substrate further includes a fourth region having a surface state different from the surface state of the first region between the first region and the outer edge of the first lateral surface of the substrate.

14. The light emitting element according to claim 1, wherein
the substrate further includes a second lateral surface of the substrate adjacent to the first lateral surface, and
the second lateral surface includes the first region and the second region that are continuous with each other without the third region being interposed therebetween.

15. The light emitting element according to claim 2, wherein
the substrate further includes a second lateral surface of the substrate adjacent to the first lateral surface, and
the second lateral surface includes the first region and the second region that are continuous with each other without the third region being interposed therebetween.

16. The light emitting element according to claim 3, wherein
the substrate further includes a second lateral surface of the substrate adjacent to the first lateral surface, and
the second lateral surface includes the first region and the second region that are continuous with each other without the third region being interposed therebetween.

17. The light emitting element according to claim 2, wherein
a length of the third region along the first direction is in a range of 5% to 50% of a length of the first region along the first direction.

18. The light emitting element according to claim 3, wherein
a length of the third region along the first direction is in a range of 5% to 50% of a length of the first region along the first direction.

* * * * *